(12) United States Patent
Kropiewnicki

(10) Patent No.: US 11,201,441 B2
(45) Date of Patent: Dec. 14, 2021

(54) PLUG-IN CONNECTOR

(71) Applicant: HARTING Electric GmbH & Co. KG, Espelkamp (DE)

(72) Inventor: Norbert Kropiewnicki, Bielefeld (DE)

(73) Assignee: HARTING Electric GmbH & Co. KG, Espelkamp (DE)

(*) Notice: Subject to any disclaimer, the term of this patent is extended or adjusted under 35 U.S.C. 154(b) by 492 days.

(21) Appl. No.: 16/316,315

(22) PCT Filed: Aug. 15, 2017

(86) PCT No.: PCT/DE2017/100688
§ 371 (c)(1),
(2) Date: Jan. 8, 2019

(87) PCT Pub. No.: WO2018/036588
PCT Pub. Date: Mar. 1, 2018

(65) Prior Publication Data
US 2021/0281020 A1    Sep. 9, 2021

(30) Foreign Application Priority Data
Aug. 24, 2016   (DE) .................... 10 2016 115 665.5

(51) Int. Cl.
*H01R 3/00* (2006.01)
*H01R 13/66* (2006.01)
(Continued)

(52) U.S. Cl.
CPC ....... *H01R 13/6683* (2013.01); *H01R 13/514* (2013.01); *H01R 24/64* (2013.01); *H05K 1/028* (2013.01)

(58) Field of Classification Search
CPC .. H01R 13/514; H01R 13/6683; H01R 24/64; H05K 1/028
(Continued)

(56) References Cited

U.S. PATENT DOCUMENTS 3,766,439 A * 10/1973 Isaacson ............ H05K 7/20545
361/714
5,998,738 A    12/1999 Li et al.
(Continued)

FOREIGN PATENT DOCUMENTS

| CN | 1819185 A | 8/2006 |
| CN | 101209003 A | 6/2008 |

(Continued)

OTHER PUBLICATIONS

German Office Action, dated Jul. 13, 2017, for German Application No. 10 2016 115 665.5, 6 pages.
(Continued)

*Primary Examiner* — Abdullah A Riyami
*Assistant Examiner* — Vladimir Imas
(74) *Attorney, Agent, or Firm* — Seed IP Law Group LLP

(57) ABSTRACT

A plug-in connector with a plug side and a connector side is provided, the plug-in connector comprising a housing, a frame, and at least one contact insert. The contact insert comprises sensors and a circuit board with electronics. According to prior art, the risk of overheating of the electronics, occurring inside the plug-in connector as a result of power dissipation, is a reason for the failure of plug-in connectors known to date. Embodiments described herein ensure heat dissipation via a cooling element so that overheating is prevented.

13 Claims, 2 Drawing Sheets

Figure 1:
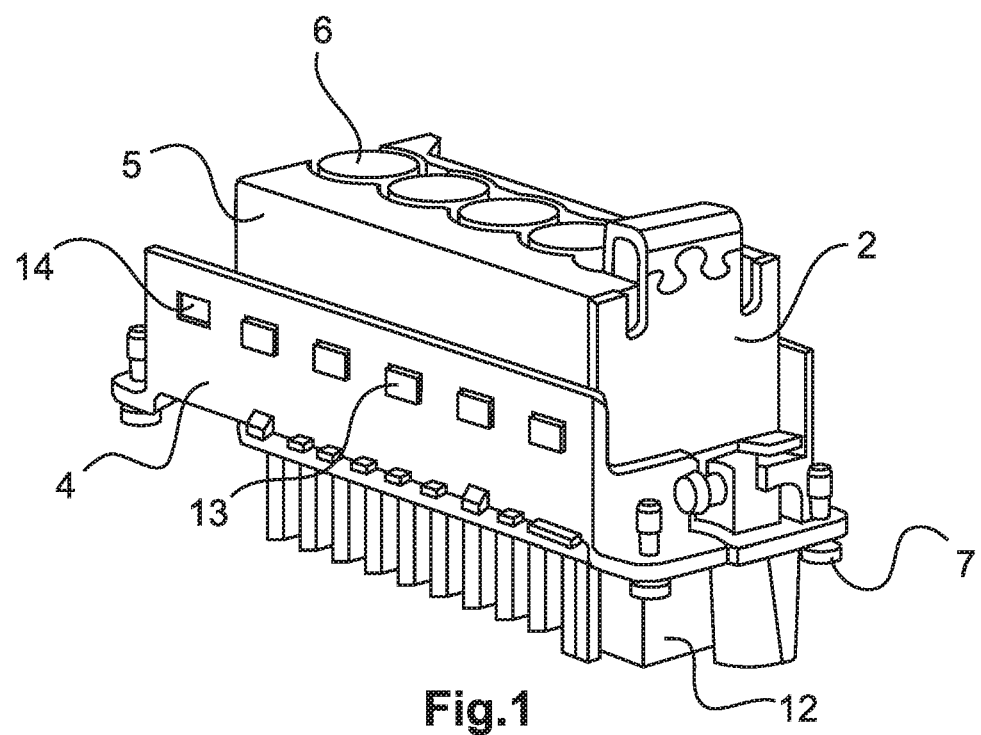

(51) Int. Cl.
  *H01R 13/514* (2006.01)
  *H01R 24/64* (2011.01)
  *H05K 1/02* (2006.01)

(58) Field of Classification Search
  USPC ............................................................ 439/489
  See application file for complete search history.

(56) References Cited

U.S. PATENT DOCUMENTS

| | | | | |
|---|---|---|---|---|
| 6,232,659 | B1* | 5/2001 | Clayton | H01L 23/13 |
| | | | | 257/723 |
| 7,289,327 | B2* | 10/2007 | Goodwin | G06F 1/20 |
| | | | | 165/104.33 |
| 7,322,860 | B2* | 1/2008 | Martich | H01R 13/6658 |
| | | | | 439/344 |
| 7,349,227 | B2* | 3/2008 | Kashiwazaki | B60R 16/0239 |
| | | | | 174/50.52 |
| 7,423,885 | B2* | 9/2008 | Cady | G11C 5/04 |
| | | | | 174/254 |
| 7,443,023 | B2* | 10/2008 | Wehrly, Jr | H05K 1/189 |
| | | | | 257/707 |
| 7,446,410 | B2* | 11/2008 | Wehrly, Jr | H05K 1/189 |
| | | | | 257/707 |
| 7,522,425 | B2* | 4/2009 | Goodwin | G11C 5/04 |
| | | | | 361/749 |
| 7,602,613 | B2* | 10/2009 | Goodwin | G11C 5/04 |
| | | | | 174/254 |
| 7,606,040 | B2* | 10/2009 | Goodwin | G11C 5/04 |
| | | | | 174/254 |
| 7,606,049 | B2* | 10/2009 | Goodwin | G06F 1/184 |
| | | | | 257/678 |
| 7,616,452 | B2* | 11/2009 | Wehrly, Jr | H05K 1/189 |
| | | | | 174/254 |
| 7,626,259 | B2* | 12/2009 | Wehrly, Jr | H05K 1/189 |
| | | | | 257/707 |
| 7,760,513 | B2* | 7/2010 | Partridge | H05K 1/189 |
| | | | | 361/803 |
| 10,231,348 | B2* | 3/2019 | Morimoto | B60L 53/16 |
| 2002/0182942 | A1 | 12/2002 | Lieb et al. | |
| 2005/0239343 | A1 | 10/2005 | Kashiwazaki | |
| 2006/0049513 | A1* | 3/2006 | Goodwin | G11C 5/143 |
| | | | | 257/712 |
| 2006/0050492 | A1 | 3/2006 | Goodwin et al. | |
| 2006/0050497 | A1* | 3/2006 | Goodwin | H01L 23/36 |
| | | | | 361/803 |
| 2007/0254530 | A1* | 11/2007 | Martich | H01R 13/73 |
| | | | | 439/676 |
| 2009/0147482 | A1 | 6/2009 | Katsuro | |
| 2011/0040506 | A1 | 2/2011 | Schalk et al. | |
| 2013/0021754 | A1 | 1/2013 | Lu et al. | |
| 2015/0233980 | A1* | 8/2015 | Umetsu | G01R 33/093 |
| | | | | 439/620.22 |
| 2017/0141518 | A1 | 5/2017 | Brüx et al. | |

FOREIGN PATENT DOCUMENTS

| | | |
|---|---|---|
| CN | 101995506 A | 3/2011 |
| CN | 102892277 A | 1/2013 |
| DE | 100 11 354 C1 | 7/2001 |
| DE | 103 23 170 A1 | 12/2004 |
| DE | 20 2007 018 306 U1 | 6/2008 |
| GB | 2 453 064 A | 3/2009 |
| JP | 2013-105714 A | 5/2013 |
| JP | 2015-201401 A | 11/2015 |
| WO | 2015/149757 A2 | 10/2015 |

OTHER PUBLICATIONS

International Search Report and Written Opinion, dated Oct. 26, 2017, for International Application No. PCT/DE2017/100688, 17 pages. (with English Translation of Search Report).

Chinese Office Action for CN application No. 201780052303.X dated Dec. 23, 2019, 7 pages.

European Patent Office, Office Action dated May 25, 2020, for European Application No. 17 761 005.2, 6 pages.

IPRP, dated Feb. 26, 2019, for International Application No. PCT/DE2017/100688, 13 pages (English translation).

* cited by examiner

PLUG-IN CONNECTOR

BACKGROUND

Technical Field

The disclosure relates to a plug-in connector having one or more contact inserts with at least one contact and a corresponding sensor. Plug-in connectors of this type are required in order to transmit currents and voltages. Moreover, it is possible by using sensor systems in the plug-in connector to simultaneously monitor the contacts that are required for the transmission procedure.

Description of the Related Art

DE 100 11 354 C1 discloses an electrical device having modules that may be arranged in rows. The electrical device heats up during use and must be cooled down. This is achieved in DE 100 11 354 C1 either by a gap between the housing base and the mounting surface so as to ensure the circulation of air, or alternatively, the housing base is configured to be very large so as to dissipate as much heat as possible. As a consequence, the electrical device is very large.

Nowadays electronic and/or sensor systems are installed directly in plug-in connectors. This is known from WO 2015/149757 A2. WO 2015/149757 A2 discloses a plug-in connector system that comprises at least one plug-in connector module that is arranged in a retaining frame. The plug-in connector module comprises a sensor that is connected via a bus system to an electronic system. The electronic system is used to evaluate the measurements obtained by the sensor.

JP 2013-105714 A discloses a cable having a plug-in connector, wherein the plug-in connector comprises in addition a current detector. The current detector is accommodated in the inner part of the plug-in connector and detects the current strengths that are flowing through the conductor of the cable.

DE 20 2007 018 306 U1 discloses a measuring device for modular plug-in connectors. The object of this measuring device is to monitor and detect measurement data. The measurement data are physical variables, such as for example current, voltage, pressure or humidity. At least one contact insert comprises for this purpose a measuring sensor for detecting the physical variables.

JP 2015-201401 A also describes, as does JP 2013-105714 A, a high voltage plug-in connector having a current sensor accommodated therein for determining magnetic fields. In this case, the data exchange is determined via incoming and outgoing signals that are transmitted by a power convertor.

A plug-in connector having an electronic circuit is known from DE 103 23 170 A1. In this case, the plug-in connector is a plug-in connector with an electronic circuit integrated in its housing. The plug-in connector has a dedicated cooling system for this electronic circuit. The plug-in connector is in particular a plug-in connector for a vehicle electronic system.

Fans and cooling bodies are known in the prior art as options for cooling items. They are used by way of example in computers and machine control cabinets. They perform their cooling function by exchanging warm air for cold air, in other words to be more precise by circulating air.

However, it is a disadvantage in the case of the known solutions that it is not possible in a closed system to dissipate heat by exchanging warm air for cold air, since in a closed system the air is unable to circulate. In the absence of sufficient cooling, systems do however experience a high loss of power in a closed system as they rapidly reach a limit temperature that should not be exceeded. As a result of the limit temperature being exceeded, the serviceable life of the electronic system is not only reduced but in the worst case scenario said system is completely destroyed. This would in turn result in the electronic system or even the entire device/plug-in connector being replaced.

BRIEF SUMMARY

Embodiments of the present invention provide a plug-in connector that has a cooling element, may be constructed in a compact manner and yet still functions effectively.

Embodiments of the present invention relate to a plug-in connector. The plug-in connector has a connection side for connecting at least one electrical or optical or pneumatic conductor. However, it is preferred that an electrical conductor is connected.

The plug-in connector comprises a plug-in side that lies opposite the connection side. The plug-in side is used for the plug-in connector to make contact with the mating plug-in connector.

The plug-in connector comprises a housing, preferably also a frame and at least one contact insert. The housing and the frame are embodied from a metal or from another stable conductive material, such as for example a synthetic material comprising a metal alloy.

The frame is preferably configured in multiple parts. It is preferred that the frame comprises at least two halves, wherein at least two halves are connected in an articulated manner to one another. Alternatively, the frame is configured in one piece.

The frame may be accommodated in the housing. Moreover, said frame may be connected to the housing. The connection is produced by way of screws, pins, studs or similar. The frame and the housing are consequently connected to one another in a mechanical manner, wherein the connection may be detached in a non-destructive manner.

It is possible to insert at least one contact insert into the frame. This at least one contact insert is fixed in the frame, in particular by latching lugs. If the at least one contact insert comprises latching lugs, then the frame comprises a corresponding number of grooves or cut-outs into which the latching lugs may engage. The frame may receive one or multiple contact inserts depending upon the design of the contact insert.

The contact insert is a fixed-pole contact insert or a modular contact insert. If a fixed-pole contact insert is inserted into the frame, said contact insert fills the frame completely. When using a modular contact insert, it is possible to insert multiple contact inserts into a frame since modular contact inserts are structurally smaller than fixed-pole contact inserts.

It is preferred that the contact insert comprises at least one contact, at least one sensor and at least one circuit board. The contacts may be contacts for transmitting currents, data or signals. The transmission of currents is preferred. The number of contacts is optional.

Sensors according to the number of contacts are arranged in the contact insert. In so doing, each sensor is allocated to one contact. The sensors are measuring sensors, in particular sensors for measuring current and voltage at the contacts. If multiple contacts are installed in the contact insert, then it is also possible to use in lieu of individual sensors one sensor board on which the sensors are arranged. The sensors are connected to the at least one circuit board by data lines or the like.

The at least one circuit board may be a commercially available circuit board, in particular a rigid-flexible circuit board since this is able to bend in the flexible regions. By virtue of the flexibility, it is possible to insert the circuit board in a space-saving manner into the contact insert. It is preferred that the circuit board is U-shaped, wherein the two parallel limbs are longer than the individual limb that connects the two parallel limbs.

Electrical and/or electronic components are assembled on the two parallel limbs. In part, these components experience a high power loss. As a result of the high power loss, the relevant components are very warm. The components form an electronic evaluating system, in particular a so-called embedded system.

This electronic evaluating system is mounted on the circuit board. The electronic evaluating system receives the data from the sensors and processes said data. Moreover, the electronic evaluating system is able to onward transmit the data. This onward transmission is performed via an interface that is suitable for transferring data. The circuit board is connected by a solder connection or a plug connection to the interface.

The interface is arranged on the plugging-in side of the plug-in connector. The interface is by way of example an RJ45 socket or an RJ45 plug, depending upon the design of the plug-in connector. Any other design of interface that is suitable for transferring data may also be selected.

In accordance with embodiments of the invention, the plug-in connector comprises a cooling element. The cooling element is used to dissipate heat. Heat is produced, as described above, on the circuit board by the electronic evaluating system. However, the heat that is produced is not sufficient to be dissipated by natural convection since the circuit board is almost completely surrounded by the housing. As a result, the electronic evaluating system heats up excessively. The temperature limit values of the components are exceeded if the heat is not dissipated. This has a damaging effect on the electronic evaluating system and consequently as a result on the entire plug-in connector. In order to avoid this risk, the cooling element in accordance with embodiments of the invention is inserted in the plug-in connector.

The cooling element comprises a thermally conductive material so that it is possible to transport heat away from the heat source. The cooling element is advantageously embodied from metal and in a particularly advantageous embodiment from copper. It is preferred to use a metal cooling element on account of the good thermally conductive properties of metals. In this respect, copper with ca. 400 W/(m*K) has the highest thermal conductivity value of the metals and it is therefore particularly advantageous that it is used.

The cooling element is curved in a U-shaped manner. It comprises two parallel-extending limbs. Said limbs are connected to a limb that is shorter than the two parallel limbs. One of the two parallel limbs is in contact with the frame. By virtue of the contact with the frame, the heat that is produced by the circuit board may be dissipated to the housing via the cooling element and further via the frame. Ideally, one of the two parallel limbs of the cooling element latches with the frame and is fixed in this manner.

In one advantageous embodiment, the circuit board and the cooling element are arranged in a manner perpendicular with respect to one another and engaging with one another in regions. In so doing, one parallel limb of the cooling element protrudes in a perpendicular manner into the region between the two parallel limbs of the circuit board without coming into contact with said contact board. Moreover, the surface of the parallel limb of the cooling element is parallel to the two parallel surfaces of the parallel limbs of the circuit board. In addition, the surface of the shorter limb of the cooling element faces in the direction of the connection side of the plug-in connector.

In order to increase the stability of the circuit board in its U-shape and to ensure that the limb of the cooling element does not come into contact with the circuit board, it is advantageous to use a spacer. Said spacer may be adjusted in a variable manner, by way of example by latching shoulders, grooves or by a screw-type structure. The spacer ensures that the circuit board and the cooling element are correctly positioned and held in place.

Ideally, the spacer is fixedly connected to the particular limb of the cooling element that protrudes into the region between the parallel limbs of the circuit board and is mounted in a floating manner in the two parallel limbs of the circuit board. The floating mounting is achieved by a bore hole in the circuit board. The bore hole has in this case a greater diameter than the diameter of the spacer. As a result of the floating mounting arrangement, the circuit board is to the greatest extent decoupled from the plugging-in and pulling-out forces.

In order to increase the stability between the cooling element and the circuit board, it is advantageous to use at least one gap filler. This can be used in addition to the spacer. The at least one gap filler fills the region between the two parallel limbs of the circuit board and the limb of the cooling element. Alternatively, it is also possible to use at least two gap fillers in lieu of one gap filler. If more than one gap filler is used, in each case at least one gap filler is arranged between one of the two parallel limbs of the circuit board and the limb of the cooling element.

The gap filler is embodied from a thermally conductive material. It is advantageous to use a thermally conductive synthetic material for the material, since this is elastic and consequently also acts as a shock absorber. Ideally, the material is silicone or alternatively a so-called thermally conductive pad. Silicone or also the thermally conductive pads have for synthetic materials the highest values with regard to thermal conductivity. Silicone has a thermal conductivity value of ca. 0.5 W/(m*K) to 5 W/(m*K).

An additional dissipation of heat is possible by using at least one gap filler. This can support the effect of the cooling element. Moreover, the gap filler supports the function of the spacer.

Embodiments of the present invention advantageously protect a circuit board that is fitted with an electronic system in the plug-in connector from exceeding the limit temperature, in that heat is dissipated from the circuit board in a safe and reliable manner. In addition, it is ensured that the positon of the circuit board in the plug-in connector is secure and stable and also the cooling element is of a compact and space-saving construction. Furthermore, as a result of using the cooling element, the serviceable life of the installed electronic system and consequently that of the plug-in connector are increased.

BRIEF DESCRIPTION OF THE SEVERAL
VIEWS OF THE DRAWINGS

Figure 2:
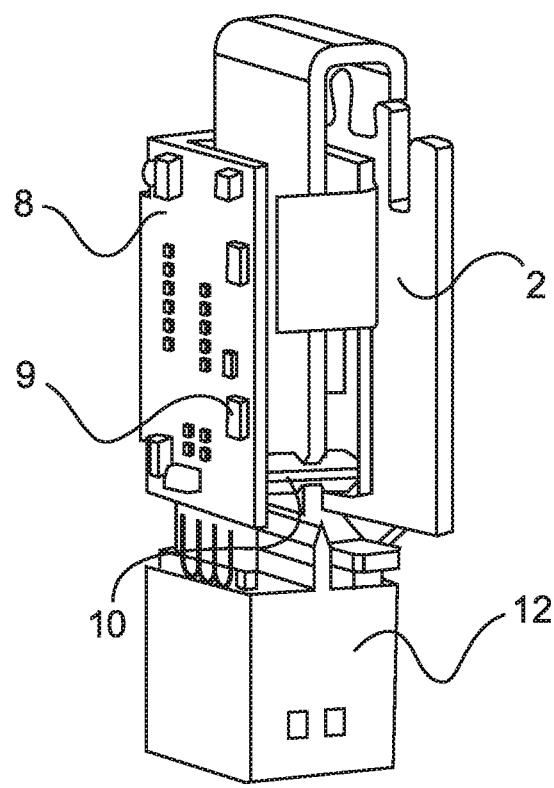
Figure 3:
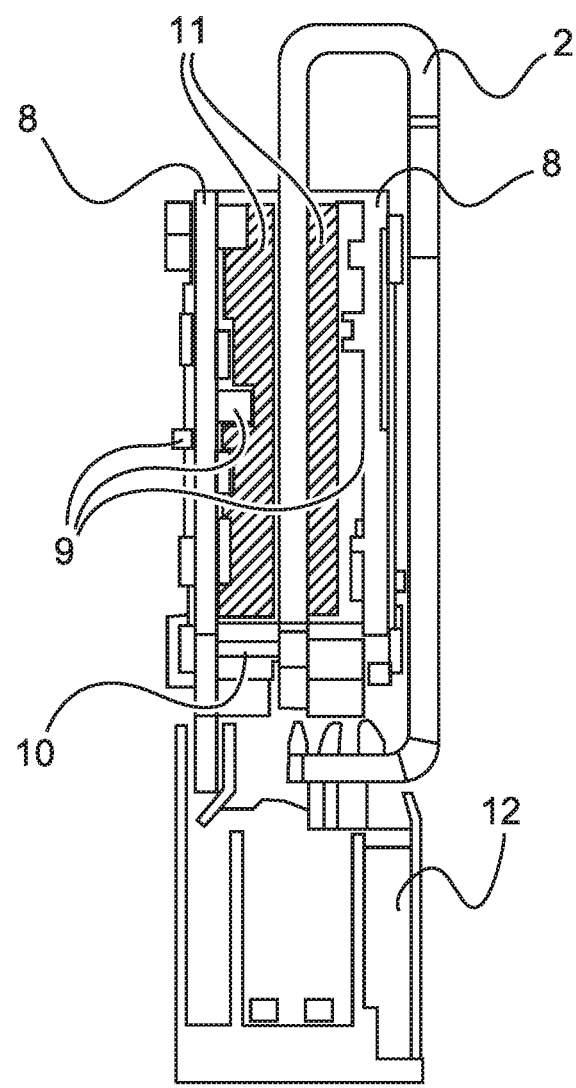

An exemplary embodiment of the invention is illustrated in the drawings and is explained in detail below. In the drawings:

FIG. 1 illustrates a perspective view of a contact insert that is received by the frame, FIG. 2 illustrates a perspective view of a circuit board having a cooling element and an interface, and FIG. 3 illustrates a cross-sectional view of the circuit board, the cooling element and the interface shown in FIG. 2.

DETAILED DESCRIPTION

The figures illustrate in part simplified, schematic views. In part, identical reference numerals are used for identical but possibly non-identical elements. Different views of like elements may have been scaled differently.

FIG. 1 illustrates a perspective view of a frame 4 with an inserted contact insert 5 and a cooling element 2 in accordance with an example embodiment of the invention. The frame 4 is a rectangular, two-part frame. In the case of the frame 4, the two halves are connected to one another by articulated joints.

Means are arranged on the four corner points of the assembled frame 4, wherein it is possible to attach the frame 4 in a housing. In the case of the present exemplary embodiment, said means are in each case a screw 7 for each corner of the frame 4. The frame 4 comprises on the two halves in each case at least one cut-out 14. The cut-outs 14 in the two halves lie opposite one another and are used to receive at least one contact insert 5.

In order to be held in the cut-outs 14 of the frame 4, the at least one contact insert 5 comprises a corresponding number of latching lugs 13. The latching lugs 13 are shaped in such a manner that they engage in the cut-outs 14 and correspond to their shape. In this exemplary embodiment, the frame 4 comprises six cut-outs 14. The contact insert 5 comprises five latching lugs 13 that latch into the corresponding cut-outs 14.

At least one contact 6 is received by the contact insert 5. In this case, there are by way of example four contacts 6. The contacts 6 comprise on their connection side orifices for receiving an electrical conductor. The contacts 6 on the plug-in side are shaped in such a manner that they may make contact with a mating plug-in connector. The contacts 6 each comprise one measuring sensor, alternatively all contacts 6 together comprise one sensor board.

Moreover, a circuit board 8 having a cooling element 2 in accordance with the example embodiment of the invention is accommodated in the contact insert 5. The circuit board 8 is completely accommodated in the contact insert 5. The cooling element 2 is curved in a U-shaped manner. One of the two longer parallel limbs of the cooling element 2 is arranged in the region of the circuit board 8. The other parallel limb of the cooling element 2 is connected to the frame 4. The shorter limb that connects the two parallel limbs of the cooling element 2 faces in the direction of the connection side of the plug-in connector 1. The interface 12 is arranged on the plug-in side, in other words lying opposite the cooling element 2 and the circuit board 8. The connection between the circuit board 8 and the interface 12 is a solder connection. The interface 12 is by way of example an RJ45 socket.

FIG. 2 illustrates a perspective view of the circuit board 8 having the cooling element 2 and the connection to the interface 12. FIG. 2 is a detailed view of the circuit board 8 that is installed in FIG. 1 and of the cooling element 2. The circuit board 8 is connected to the interface 12 by a solder connection as already described with regard to FIG. 1. Four connection points at which solder sites are located are provided in this exemplary embodiment.

The circuit board 8 is curved in a U-shaped manner. Said circuit board 8 comprises two parallel limbs. Said parallel limbs are connected by a shorter limb that is arranged approximately at a right angle with respect to the two parallel limbs. This shorter limb of the circuit board 8 protrudes in the direction of the cut-outs 14 of the frame 4 or in the direction of the latching lugs 13 of the contact insert 5.

The two parallel limbs of the circuit board 8 are equipped with at least one electronic/electrical component. Ideally, this at least one component forms an electronic evaluating system 9. The electronic evaluating system 9 is constructed in such a manner that it receives and processes data from the sensors at the contacts 6 and is able to transmit said data via the interface 12.

The cooling element 2 protrudes with one of the two parallel limbs into the region between the two parallel limbs of the circuit board 8 without coming into contact with said circuit board 8. The shorter limb of the cooling element 2 faces in the direction of the connection side.

The other of the two parallel limbs of the cooling element 2 is connected to the frame 4 and is likewise not in contact with the circuit board 8. In order to increase the stability of the connection between the frame 4 and the cooling element 2, the frame 4 or alternatively the interface 12 comprises means or devices for latching with the cooling element 2.

A receiving device is provided on the particular limb of the cooling element 2 that is arranged in the region between the two parallel limbs of the circuit board 8. Bore holes are likewise provided at the corresponding same height on the two parallel limbs of the circuit board.

A spacer 10 is received by the receiving device on the cooling element 2. Said spacer 10 is attached in a relatively fixed manner in the receiving device on the cooling element 2. The spacer 10 is received by the receiving device on the limbs of the circuit board 8. However, the diameter of the receiving devices on the circuit board 8 is larger than the diameter of the spacer 10. This ensures that the circuit board 8 is not coupled to the plugging-in and pulling-out forces. The spacer 10 is used in addition to hold the circuit board 8 and the cooling element 2 in place.

In the present exemplary embodiment, the spacer 10 comprises grooves in which the circuit board 8 and/or the cooling element 2 are held. Alternatively, the spacer 10 may also be formed in a screw-like manner or with latching shoulders. Ideally, the spacer 10 has a cylindrical shape, alternatively a cuboid shape.

FIG. 3 illustrates a cross-sectional view of the example embodiment. The cross-section extends through the circuit board 8 together with the electronic evaluating system 9, the cooling element 2, the spacer 10 and the interface 12. In this exemplary embodiment, it is clear that a latching arrangement of the cooling element 2 is advantageous. Ideally, the latching arrangement, by way of example in the form of latching lugs, is arranged for this purpose in the region of the interface 12.

The particular parallel limb of the cooling element 2 that is not located in the region between the parallel limbs of the circuit board 8 is longer than the other. This longer piece is bent at a right angle in the direction of the circuit board 8. Said longer piece comprises cut-outs and the latching lugs or other latching devices are able to latch into said cut-outs. As a consequence, the plugging-in and pulling-out forces that would act on the circuit board 8 are advantageously further reduced.

In this preferred embodiment, a gap filler 11 is arranged respectively between the parallel limbs of the circuit board 8 and the cooling element 2.

The gap filler 11 is a thermally conductive pad embodied from silicone. This increases the dissipation of heat and also the stability between the circuit board 8 and the cooling element 2. The gap filler 11 may be individually shaped or has a pre-fabricated shape. By virtue of using the cooling element 2 in combination with the gap filler 11, it is possible to achieve a particularly efficient dissipation of heat in the direction of the frame 4, as a result of which the electronic evaluating system 9 is prevented from overheating.

In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A plug-in connector having a plug-in side and a connection side, the plug-in connector comprising:
   a frame and at least one contact insert insertably received in the frame,
   wherein the at least one contact insert comprises at least one contact, at least one sensor that is allocated to the respective contact, and a circuit board,
   wherein the circuit board comprises an interface in a plug-in region of the plug-in connector,
   wherein the circuit board comprises an electronic evaluating system,
   wherein the electronic evaluating system receives and evaluates data from the at least one sensor and transmits said data via the interface,
   wherein the plug-in connector comprises a cooling element separate and distinct from the frame,
   wherein the cooling element is curved in a U-shaped manner and comprises two parallel limbs,
   wherein the circuit board is arranged curved in a U-shaped manner in the contact insert and comprises two parallel limbs, and
   wherein the cooling element protrudes with one of the two parallel limbs of the cooling element into a region between the two parallel limbs of the circuit board of the contact insert without coming into contact with said circuit board, and with the other one of the two parallel limbs of the cooling element in contact with the frame.

2. The plug-in connector as claimed in claim 1, wherein the cooling element is embodied from a thermally conductive material.

3. The plug-in connector as claimed in claim 1, wherein the cooling element is embodied from copper.

4. The plug-in connector as claimed in claim 1, wherein one limb of the cooling element makes contact with the frame.

5. The plug-in connector as claimed in claim 1, wherein the circuit board comprises rigid and flexible regions.

6. The plug-in connector as claimed in claim 1, wherein the circuit board and the cooling element are arranged in a manner perpendicular with respect to one another and engaging with one another in regions.

7. The plug-in connector as claimed in claim 1, wherein a spacer, the circuit board and the cooling element are positioned spaced apart from one another.

8. The plug-in connector as claimed in claim 7, wherein the spacer may be adjusted in a variable manner.

9. The plug-in connector as claimed in claim 1, wherein at least one gap filler is arranged between the circuit board and the cooling element.

10. The plug-in connector as claimed in claim 9, wherein the gap filler is embodied from a thermally conductive material.

11. The plug-in connector as claimed in claim 1, wherein the electronic evaluating system is an embedded system.

12. The plug-in connector as claimed in claim 1, wherein the interface is an RJ45 connection or an RJ45 socket.

13. The plug-in connector as claimed in claim 12, wherein the circuit board comprises a solder connection, and wherein the solder connection connects the interface and the circuit board.

* * * * *